US010491787B2

(12) United States Patent
Mullenary et al.

(10) Patent No.: US 10,491,787 B2
(45) Date of Patent: Nov. 26, 2019

(54) ELECTROSTATIC DISCHARGE MITIGATION SYSTEMS AND METHODS FOR IMAGING DEVICES

(71) Applicant: FLIR SYSTEMS, INC., Wilsonville, OR (US)

(72) Inventors: Mark V. Mullenary, Goleta, CA (US); Thad Lieb, Goleta, CA (US); Bruce A. Covington, Santa Barbara, CA (US)

(73) Assignee: FLIR Systems, Inc., Wilsonville, OR (US)

( * ) Notice: Subject to any disclaimer, the term of this patent is extended or adjusted under 35 U.S.C. 154(b) by 0 days.

(21) Appl. No.: 16/155,718

(22) Filed: Oct. 9, 2018

(65) Prior Publication Data

US 2019/0045096 A1 Feb. 7, 2019

Related U.S. Application Data

(63) Continuation-in-part of application No. 15/466,599, filed on Mar. 22, 2017, now Pat. No. 10,230,909.
(Continued)

(51) Int. Cl.
*H04N 5/225* (2006.01)
*H01L 27/146* (2006.01)
*H01L 27/02* (2006.01)

(52) U.S. Cl.
CPC ....... *H04N 5/2254* (2013.01); *H01L 27/0248* (2013.01); *H01L 27/14618* (2013.01);
(Continued)

(58) Field of Classification Search
CPC ...... H04N 5/2257; H04N 5/33; H04N 5/2254; H04N 5/22521; H04N 5/2252; H01L 27/14618; H01L 27/0248
(Continued)

(56) References Cited

U.S. PATENT DOCUMENTS 5,132,612 A 7/1992 Burns et al.
5,173,766 A 12/1992 Long et al.
(Continued)

FOREIGN PATENT DOCUMENTS

CN 1484305 3/2004
EP 1986297 10/2008
(Continued)

OTHER PUBLICATIONS

"Gauss's Law," retrieved on Apr. 19, 2017, 3 pages [online]. Retrieved from the Internet: <http://hyperphysics.phy-astr.gsu.edu/hbase/electric/gaulaw.html>.

*Primary Examiner* — David P Porta
*Assistant Examiner* — Meenakshi S Sahu
(74) *Attorney, Agent, or Firm* — Haynes and Boone, LLP

(57) ABSTRACT

Various techniques are provided to facilitate electrostatic discharge mitigation for imaging devices. In one example, an imaging device includes an imager assembly. The imaging device further includes a lens holder. The lens holder includes a receiving interface configured to receive a lens assembly therein. The lens holder further includes an alignment pin including electrically conductive material and coupled to the imager assembly to provide an electrostatic discharge path via the imager assembly, where a first portion of the alignment pin has the electrically conductive material exposed and a second portion of the alignment pin has an insulating layer disposed thereon. Related methods and systems are also provided.

20 Claims, 8 Drawing Sheets

Related U.S. Application Data which is a continuation of application No. PCT/US2015/051798, filed on Sep. 23, 2015, which is a continuation-in-part of application No. 14/852,313, filed on Sep. 11, 2015, now Pat. No. 10,182,195.

(60) Provisional application No. 62/571,160, filed on Oct. 11, 2017, provisional application No. 62/222,708, filed on Sep. 23, 2015, provisional application No. 62/054,313, filed on Sep. 23, 2014.

(52) U.S. Cl.
CPC ......... *H04N 5/2252* (2013.01); *H04N 5/2257* (2013.01); *H04N 5/22521* (2018.08)

(58) Field of Classification Search
USPC .......................................................... 250/332
See application file for complete search history.

(56) References Cited

U.S. PATENT DOCUMENTS

| | | |
|---|---|---|
| 5,730,191 A | 3/1998 | Cooper et al. |
| 6,080,930 A | 6/2000 | Lommen et al. |
| 6,276,135 B1 | 8/2001 | Ellett |
| 6,354,885 B1 | 3/2002 | Bradley et al. |
| 6,381,147 B1 | 4/2002 | Hayward et al. |
| 6,382,997 B2 * | 5/2002 | Semmeling ........ H01R 13/6485 257/530 |
| 6,424,525 B1 * | 7/2002 | MacLeod .................. G06F 1/16 312/223.1 |
| 6,476,449 B1 | 11/2002 | Lin |
| 6,497,267 B1 | 12/2002 | Azar et al. |
| 6,611,025 B2 | 8/2003 | Lin |
| 6,613,979 B1 | 9/2003 | Miller et al. |
| 6,648,661 B1 * | 11/2003 | Byrne .................. G06F 1/1632 439/188 |
| 6,997,722 B2 | 2/2006 | Mangold |
| 7,161,772 B2 | 1/2007 | Iben |
| 7,301,229 B2 | 11/2007 | Yau |
| 7,479,680 B2 | 1/2009 | Dunnihoo et al. |
| 7,576,990 B2 | 8/2009 | Ni et al. |
| 7,768,789 B2 | 8/2010 | Ni et al. |
| 8,169,760 B2 | 5/2012 | Chang et al. |
| 8,397,639 B2 | 3/2013 | Gordon et al. |
| 8,480,066 B2 | 7/2013 | Anderson et al. |
| 8,960,091 B2 | 2/2015 | Gordon et al. |
| 2006/0024986 A1 | 2/2006 | Rafter et al. |
| 2006/0141847 A1 | 6/2006 | Ngo |
| 2009/0261926 A1 * | 10/2009 | Wolk .................... H01P 11/002 333/99 MP |
| 2016/0300831 A1 | 10/2016 | Salman et al. |

FOREIGN PATENT DOCUMENTS

| | | |
|---|---|---|
| WO | WO 1999/060834 | 11/1999 |
| WO | WO 2006/071386 | 7/2006 |

* cited by examiner

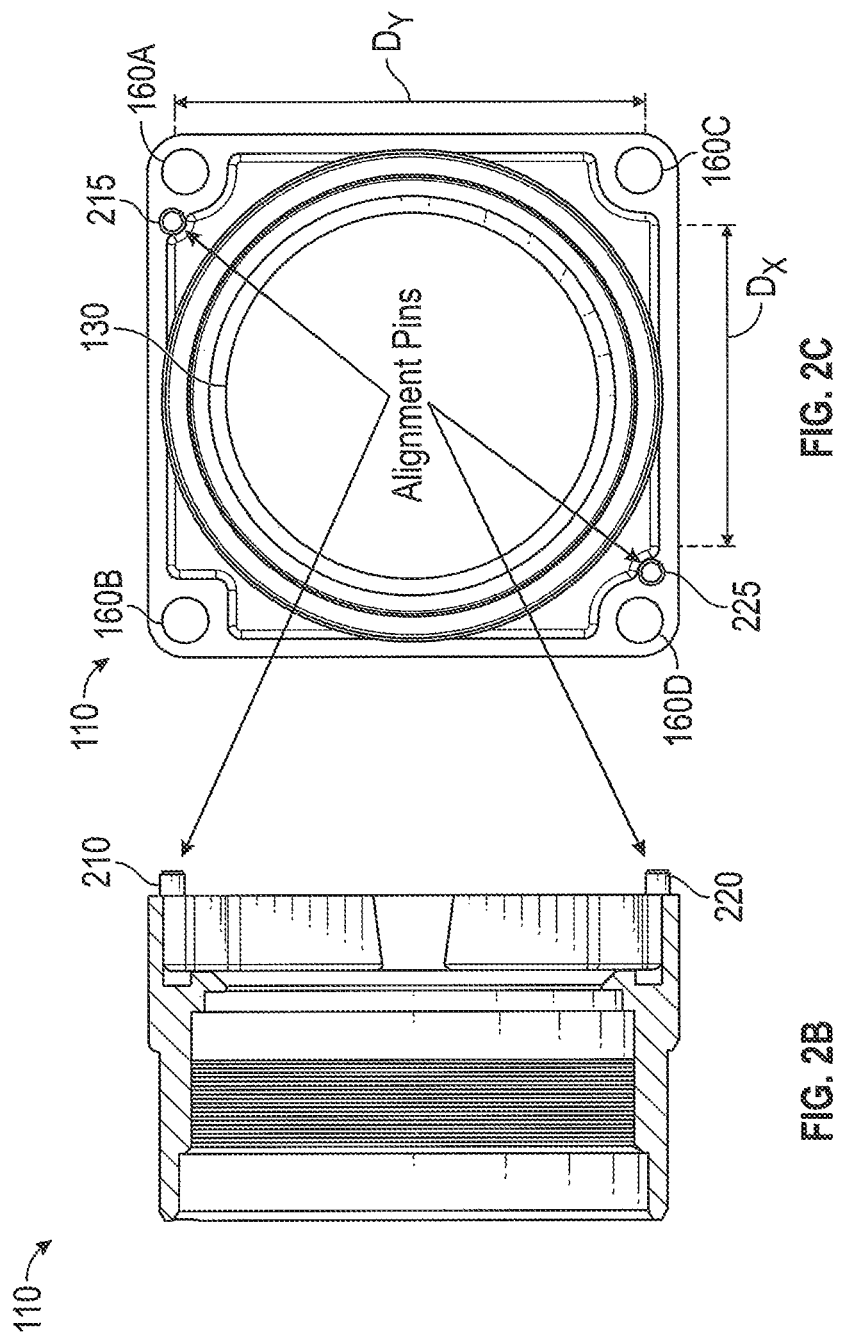

ELECTROSTATIC DISCHARGE MITIGATION SYSTEMS AND METHODS FOR IMAGING DEVICES

CROSS-REFERENCE TO RELATED APPLICATIONS

This application claims the benefit of and priority to U.S. Provisional Patent Application No. 62/571,160 filed Oct. 11, 2017 and entitled "ELECTROSTATIC DISCHARGE MITIGATION SYSTEMS AND METHODS FOR IMAGING DEVICES," which is incorporated herein by reference in its entirety.

This application is a continuation-in-part of U.S. patent application Ser. No. 15/466,599 filed Mar. 22, 2017 and entitled "MODULAR SPLIT-PROCESSING INFRARED IMAGING SYSTEM," which is incorporated herein by reference in its entirety.

U.S. patent application Ser. No. 15/466,599 filed Mar. 22, 2017 is a continuation of International Patent Application No. PCT/US2015/051798 filed Sep. 23, 2015 and entitled "MODULAR SPLIT-PROCESSING INFRARED IMAGING SYSTEM," which is incorporated herein by reference in its entirety.

International Patent Application No. PCT/US2015/051798 filed Sep. 23, 2015 claims the benefit of and priority to U.S. Provisional Patent Application No. 62/222,708 filed Sep. 23, 2015 and entitled "MODULAR SPLIT-PROCESSING INFRARED IMAGING SYSTEM," which is hereby incorporated by reference in its entirety.

International Patent Application No. PCT/US2015/051798 filed Sep. 23, 2015 is a continuation-in-part of U.S. patent application Ser. No. 14/852,313 filed Sep. 11, 2015 and entitled "PROTECTIVE WINDOW FOR AN INFRARED SENSOR ARRAY," which claims the benefit of and priority to U.S. Provisional Patent Application No. 62/054,313 filed Sep. 23, 2014 and entitled "PROTECTIVE WINDOW FOR AN INFRARED SENSOR ARRAY," all of which are hereby incorporated by reference in their entirety.

TECHNICAL FIELD

The present disclosure relates generally to imaging devices and, more particularly, to electrostatic discharge mitigation systems and methods for imaging devices.

BACKGROUND

Static charges (e.g., static positive or negative charges) may accumulate on objects and result in a stored capacitance between objects of opposite charges. An electrostatic discharge (ESD) results in current flow between these objects. For example, a human hand and a doorknob may have opposite charge and result in an electrostatic discharge (i.e., current flow) between the hand and the doorknob when distance is closed between the hand and the doorknob. In some cases, such electrostatic discharge may occur involving electronic equipment and techniques are needed to minimize detrimental results.

SUMMARY

One or more embodiments may be used to provide electrostatic discharge mitigation for imaging devices. In some embodiments, an imaging device includes a lens holder and an imager assembly. The lens holder may include one or more alignment pins that can couple to the imager assembly and direct charges accumulated on the lens holder to electrostatic discharge paths (e.g., also referred to as electrostatic dissipation paths) provided through the imager assembly. These electrostatic discharge paths may direct accumulated charges onto surfaces of the imager assembly and away from internal electronic components of the imager assembly, which may be sensitive to electrostatic discharge.

In one embodiment, an imaging device may include an imager assembly. The imaging device may further include a lens holder. The lens holder may further include a receiving interface configured to receive a lens assembly therein. The lens holder may further include an alignment pin including electrically conductive material and coupled to the imager assembly to provide an electrostatic discharge path via the imager assembly. A first portion of the alignment pin may have the electrically conductive material exposed, and a second portion of the alignment pin may have an insulating layer disposed on the electrically conductive material.

In another embodiment, a method of making an imaging device may include providing a lens holder coated with an insulating layer. The lens holder may include an alignment pin, where the alignment pin includes electrically conductive material with the insulating layer disposed thereon. The method may include removing a portion of the insulating layer from the alignment pin to provide an exposed portion of the alignment pin. The method may include coupling the alignment pin to an imager assembly to provide an electrostatic discharge path via the imager assembly.

The scope of the present disclosure is defined by the claims. A more complete understanding of embodiments of the present disclosure will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIG. 2B illustrates a side view of a lens holder in accordance with one or more embodiments of the present disclosure.

FIG. 2C illustrates a rear view of a lens holder in accordance with one or more embodiments of the present disclosure.

Embodiments of the present disclosure and their advantages are best understood by referring to the detailed description that follows. It should be appreciated that like reference numerals are used to identify like elements illustrated in one or more of the figures.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more embodiments. In one or more instances, structures and components are shown in block diagram form in order to avoid obscuring the concepts of the subject technology. One or more embodiments of the subject disclosure are illustrated by and/or described in connection with one or more figures and are set forth in the claims.

Various techniques are provided to facilitate electrostatic discharge mitigation for imaging devices. In some embodiments, an imaging device includes a lens holder and an imager assembly. The lens holder may include one or more alignment pins for facilitating optical alignment of the lens holder, imager assembly, and any associated optics (e.g., lenses within the lens holder). In some aspects, the alignment pin(s) may be formed of electrically conductive material and then coated with an insulating layer. For example, the alignment pin(s) may be formed together with one or more other portions of the lens holder. After the coating has been applied, post-machining may be performed to expose the electrically conductive material of at least a portion of each alignment pin.

The alignment pin(s) can couple to the imager assembly and direct charges accumulated on the lens holder to electrostatic discharge paths provided through the imager assembly. These electrostatic discharge paths may direct accumulated charges onto surfaces of the imager assembly and away from internal electronic components of the imager assembly, which may be sensitive to electrostatic discharge. By providing electrostatic discharge mitigation, the alignment pin(s) increases immunity of the imaging device to electrostatic discharges, thus aiding in prevention of device malfunction, damage (e.g., permanent damage), and/or any adverse effects, to sensitive electronics of the imaging device (e.g., in the imager assembly) and/or any system coupled to the imaging device.

Figure 1A:
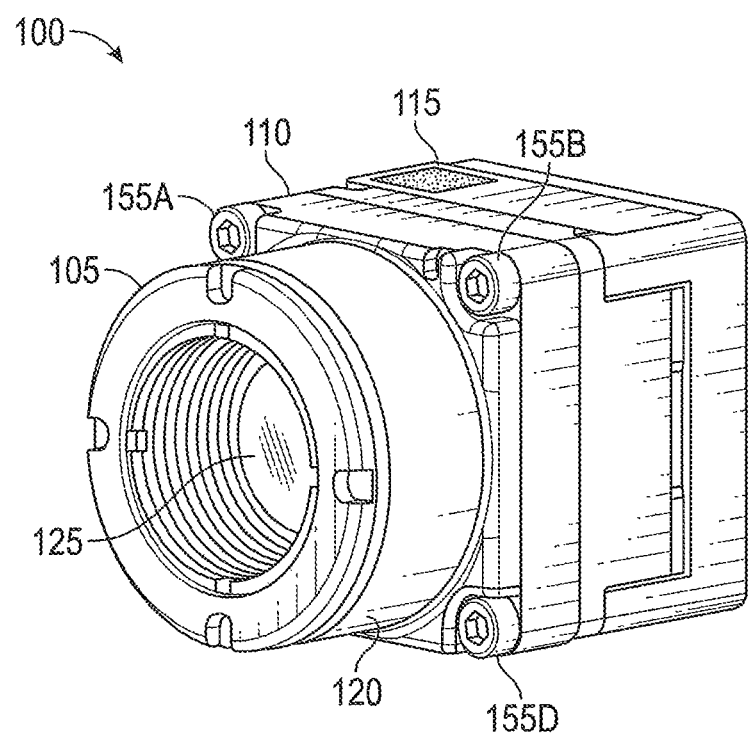
FIG. 1A illustrates an imaging device in which electrostatic discharge mitigation is facilitated in accordance with one or more embodiments of the present disclosure.
Figure 1B:
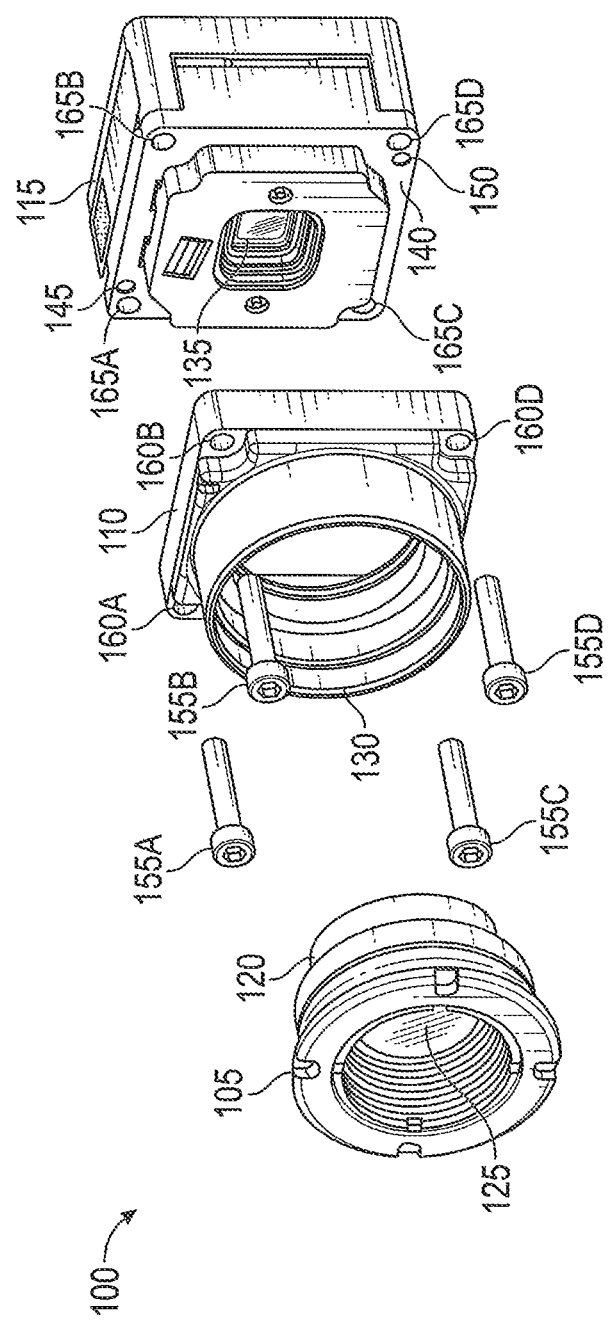
FIG. 1B illustrates an exploded view of the imaging device of FIG. 1A.

FIG. 1A illustrates an imaging device 100 in which electrostatic discharge mitigation is implemented in accordance with one or more embodiments of the present disclosure. In this regard, FIG. 1A illustrates a perspective front view of the imaging device 100. FIG. 1B illustrates an exploded view of the imaging device 100 of FIG. 1A. Not all of the depicted components may be required, however, and one or more embodiments may include additional components shown in the figures. Variations in the arrangement and type of the components may be made without departing from the spirit or scope of the claims as set forth herein. Additional components, different components, and/or fewer components may be provided.

The imaging device 100 includes a lens assembly 105, a lens holder 110, and an imager assembly 115. The lens assembly 105 includes a lens barrel 120 and a lens 125 within the lens barrel 120. The lens barrel 120 may be non-conductive. As one example, the lens barrel 120 may be formed of anodized aluminum. Alternatively or in addition, the lens barrel 120 may be formed of other non-conductive material as would be understood by one skilled in the art.

The lens holder 110 includes a receiving interface 130 to receive the lens assembly 105 and secure the lens assembly 105 to the lens holder 110. As shown in FIG. 1A, at least a portion of the lens assembly 105 is received within the receiving interface 130 of the lens holder 110. In this regard, the lens holder 110 may include an inner surface that defines an aperture to receive the lens assembly 105. In some cases, the receiving interface 130 and/or the lens barrel 120 may include threads and/or other engagement features to facilitate securing of the lens barrel 120 to the lens holder 110.

The lens holder 110 couples to the imager assembly 115. The lens holder 110 may include an electrically conductive material with an insulating layer disposed thereon. For example, the insulating layer may be provided as an insulating coating over the electrically conductive material. In an aspect, the insulating layer may provide chemical stability (e.g., corrosion protection), thermal stability, structural properties (e.g., wear resistance, hardness, strain tolerance), and/or other properties.

In one case, the electrically conductive material may include magnesium, magnesium alloy, and/or other suitable electrically conductive material as would be understood by one skilled in the art. In one case, the insulating layer may include an oxide material, such as keronite. The insulating layer may also include an e-coat paint (e.g., paint provided through an electrophoretic painting process). Alternatively or in addition, other materials may be utilized for the insulating layer of the lens holder 110 as would be understood by one skilled in the art.

The imager assembly 115 includes an aperture 135 to receive image data representative of a scene. The image data may be provided as electromagnetic radiation passed through the lens assembly 105 (e.g., through the lens 125) and coupled into the imager assembly 115 via the aperture 135. The imager assembly 115 may include an image capture circuit to capture the image data (e.g., still image data and/or video data). For example, the image capture circuit may include one or more image sensors that each capture image data representative of a portion of the scene. The image sensor(s) may include a multi-pixel detector, such as a focal plane array (FPA). The image capture circuit may include a readout circuit, such as a readout integrated circuit (ROIC), to generate signals indicative of the image data captured by the image sensor(s). The imager assembly 115 may be conductive. In this regard, a housing of the imager assembly 115 may be conductive. As one example, the imager assembly 115 may include magnesium or magnesium alloy. Alternatively or in addition, the imager assembly 115 may include other conductive material as would be understood by one skilled in the art.

In some cases, the imager assembly 115 may include a shutter to selectively pass image data into the imager assembly 115 by blocking or not blocking the aperture 135. When the aperture 135 is not blocked, the image data directed to the imager assembly 115 by the lens assembly 105 is coupled to the image capture circuit (e.g., image sensor(s) and associated readout circuitry) of the imager assembly 115 to allow capture of the image data by the image capture circuit. When the aperture 135 is blocked, the image data does not reach the image capture circuit of the imager assembly 115.

In some aspects, the imager assembly 115 may include processing electronics to receive, process, transmit, and/or record the captured image data. The processing electronics may couple to supporting electronics that may further utilize (e.g., process, record, etc.) image data from the processing electronics. The supporting electronics may be provided by a system coupled to the imaging device 100.

The lens holder 110 may be securely coupled (e.g., sealed together, held together, attached, and/or other coupling mechanism) to the imager assembly 115 using engagement elements 155A-D. Securing the lens holder 110 (and the lens assembly 105 at least partially therein) to the imager assembly 115 may allow proper optical alignment of the lens assembly 105, lens holder 110, and imager assembly 115. For example, when aligned, the lens assembly 105, lens holder 110, and imager assembly 115 may share a common optical axis.

To allow the coupling, the engagement elements 155A-D may be provided through corresponding receiving structures 160A-D (e.g., receiving apertures) of the lens holder 110 and corresponding receiving structures 165A-D (e.g., receiving apertures) of the imager assembly 115. In an aspect, as shown in FIGS. 1A and 1B, the engagement elements 155A-D are screws that can be inserted through the receiving structures 160A-D and 165A-D and tightened to securely couple the lens holder 110 to the imager assembly 115. In another aspect, the engagement elements 155A-D may generally be any other mechanical/physical fasteners, glue, epoxy, sealers and/or sealants, other chemical bonding mechanism, and/or generally any mechanism to securely couple the lens holder 110 to the imaging assembly 115. The lens holder 110 may be secured to the imager assembly 115 before the lens holder 110 receives therein the lens assembly 105, after the lens holder 110 has received therein the lens assembly 105, or while the lens holder 110 is receiving therein the lens assembly 105.

In some embodiments, the lens holder 110 includes one or more alignment pins (not shown in FIGS. 1A and 1B). The alignment pin(s) may facilitate proper optical alignment of the lens assembly 105, lens holder 110, and imager assembly 115. For example, the alignment pin(s) may help ensure that the lens assembly 105, lens holder 110, and imager assembly 115 share a common optical axis.

The alignment pin(s) may include an electrically conductive material (e.g., magnesium) and an insulating layer (e.g., keronite) over a portion of the electrically conductive material. As an example, a first portion of each alignment pin may have electrically conductive material with an insulating layer disposed thereon, and a second portion (e.g., a remaining portion) of each alignment pin may have the electrically conductive material exposed. In some cases, the alignment pin(s) may have the same material composition for the electrically conductive material and insulating layer as the electrically conductive material and insulating layer, respectively, of a remainder of the lens holder 110.

The exposed electrically conductive portion of the alignment pin(s) can couple to the imager assembly 115 to provide a corresponding path(s) for allowing electrostatic dissipation. For example, the exposed electrically conductive portion of the alignment pin(s) may be an electrically conductive tip of the alignment pin(s). In this regard, when the lens holder 110 is charged, the alignment pin(s) may focus an electric field from the lens holder 110 onto surfaces of the imager assembly 115 away from internal electronic components of the imager assembly 115, where the internal electronic components may be sensitive to electrostatic discharge. As an example, the alignment pin(s) may focus the electric field onto external surfaces of the imager assembly 115, such as external surfaces of a sensor frame of the imager assembly 115, and the imager assembly 115 may provide a corresponding electrostatic discharge path for each alignment pin to allow electrostatic discharge. Such electrostatic dissipation paths may be provided (e.g., positioned, routed) to mitigate electrostatic discharge that may adversely affect the imaging device 100 as a whole and the imager assembly 115 in particular (e.g., electronics in the imager assembly 115) to provide electrostatic discharge paths.

Securing the lens holder 110 to the imager assembly 115 may cause the alignment pin(s) to electrically couple the imager assembly 115. In some cases, the alignment pin(s) may be in physical contact with the imager assembly 115. In FIG. 1B, the external surface 140 of the imager assembly 115 has defined thereon receiving structures 145 and 150 (e.g., receiving apertures). In some cases, when the lens holder 110 is attached to the imager assembly 115, a periphery of each alignment pin may be in contact with a periphery (e.g., an inner surface) of the receiving structures 145 and 150.

Although FIGS. 1A and 1B show a lens assembly with a single lens, the lens assembly may include one or more additional optical elements, such as one or more mirrors, beamsplitters, and/or lenses to facilitate directing of image data from a scene to the imaging assembly 115. In some cases, the optical elements may provide adjustable optical parameters to the imaging device 100, including adjustable zoom, resolution, focus, and/or other optical parameter. For example, the imager assembly 115 (e.g., the processing electronics) and/or supporting electronics may provide control signals to adjust the optical parameters of the optical elements.

In some aspects, the imaging device 100 may be utilized for capturing infrared image data of a scene. For example, the lens assembly 105 may be configured to pass and the imager assembly 115 may be configured to capture and process infrared radiation, such as mid-wave infrared (MWIR) radiation (e.g., electromagnetic radiation with wavelength of 2-5 μm) and/or long-wave (LWIR) radiation (e.g., electromagnetic radiation with wavelength of 7-14 μm). Alternatively and/or in addition, the imaging device 100 may be utilized for capturing visible-light image data, and/or image data associated with other parts of the electromagnetic spectrum. In this regard, the imaging device 100 may be provided as, or as part of, an infrared imaging system. An example of an infrared imaging system is provided in U.S. patent application Ser. No. 15/466,599 filed Mar. 22, 2017 and entitled "MODULAR SPLIT-PROCESSING INFRARED IMAGING SYSTEM", which is incorporated herein by reference in its entirety.

In an embodiment, the imaging device 100 may be coupled to or incorporated into a system, such as a portable device (e.g., mobile phone), a vehicle (e.g., a terrestrial, naval, aerial, and/or space vehicle), or generally any electronic system that may utilize the imaging device 100 for imaging applications. The imaging device 100 may capture image data and provide the captured image data (e.g., with or without processing) to the system.

Figure 2A:
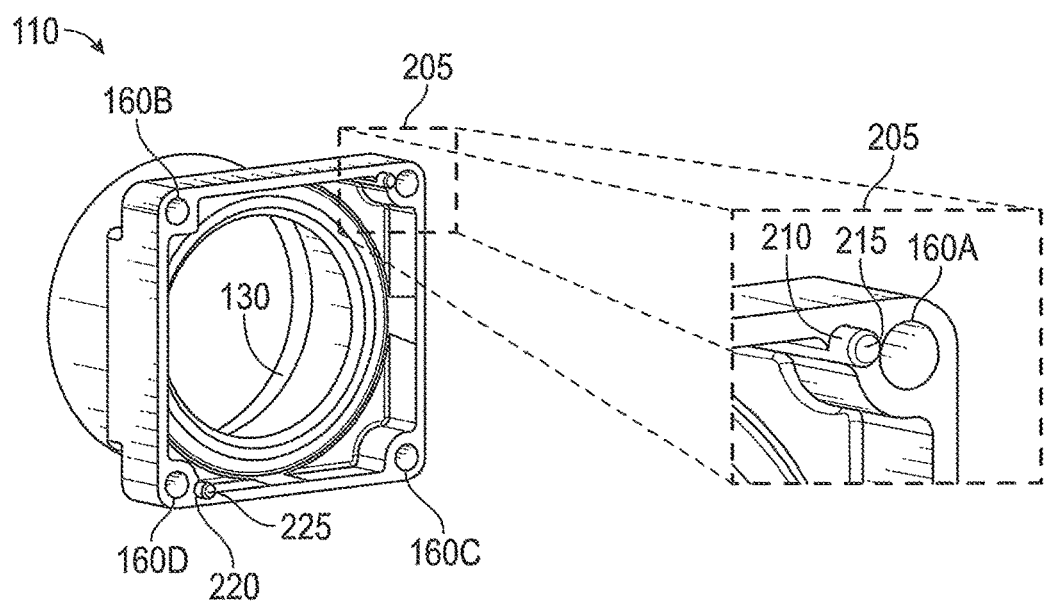
FIG. 2A illustrates a perspective rear view of a lens holder in accordance with one or more embodiments of the present disclosure.

FIGS. 2A, 2B, and 2C illustrate a perspective rear view, side view, and rear view, respectively, of the lens holder 110 in accordance with one or more embodiments of the present disclosure. FIG. 2A also shows a zoomed-in view of a portion 205 of the lens holder 110. The lens holder 110 includes an alignment pin 210 and 220 with an exposed electrically conductive portion 215 and 225, respectively. In FIGS. 2A-2C, the electrically conductive portions 215 and 225 are exposed electrically conductive surfaces of the alignment pins 210 and 220, respectively. The alignment pins 210 and 220 may be positioned such that they are in contact with the receiving structures 145 and 150, respectively, of the imager assembly 115 to provide two parallel electrostatic dissipation paths onto surfaces of the imager assembly 115 away from internal electronic components of the imager assembly 115.

In an embodiment, the alignment pins 210 and 220 may be formed together with (e.g., integrally with, as a single piece with) other structural parts of the lens holder 110. In a manufacturing process, the lens holder 110 may be formed with an electrically conductive material and then coated with an insulating material. In this regard, pins are formed as part of the lens holder 110 during this manufacturing process such that these pins have the electrically conductive material coated with the insulating material.

A post-machining process may then be performed on these pins to form the alignment pins 210 and 220 and electrically conductive portions 215 and 225 shown in FIGS. 2A through 2C. In an aspect, the pins may be grinded down to an appropriate length (e.g., for facilitating alignment of the components of the imaging device 100) and to expose the electrically conductive material (e.g., at the tip of these pins). The grinding may be performed to adjust a shape and/or a size (e.g., length, width) of the exposed electrically conductive material. In one case, the exposed electrically conductive material may be narrower than portions of the pins that are not grinded. The exposed portion may be, or may have, a conical shape, a sloped-square shape, a flat surface, and/or other shape.

In another embodiment, the alignment pins 210 and 220 may be formed separately and then coupled to (e.g., attached to) structural features of the lens holder 110. As an example, the alignment pins 210 and 220 may be separately formed and coupled to (e.g., inserted into or through, adhered using an adhesive to) corresponding receiving structures provided by the lens holder 110.

A post-machining process similar to that described above may be performed before or after the alignment pins 210 and 220 are coupled to the lens holder 110. After coupling the alignment pins 210 and 220 to the lens holder 110, the alignment pins 210 and 220 may be considered as being part of (e.g., integrated with) the lens holder 110.

Other manners by which to form the alignment pins 210 and 220 may be utilized. For example, the alignment pins 210 and 220 may be manufactured such that a portion of the alignment pins 210 and 220 are prevented from being coated with an insulating material, such as through masking techniques.

An example distance $D_X$ between the alignment pins 210 and 220 may be between 15 mm to 25 mm. An example distance $D_Y$ between the alignment pins 210 and 220 may be between 10 mm and 20 mm. Such distances are provided by way of non-limiting example only. The distances may be larger or smaller, and/or the alignment pins 210 and 220 may have sizes, shapes, and/or positions different from those shown in FIGS. 2A through 2C. Further, although FIGS. 1A-1B and 2A-2C illustrates an example of a lens holder with two alignment pins, a lens holder may include fewer alignment pins (e.g., a single alignment pin), more alignment pins, and/or different positioning of the alignment pins relative to the example shown in FIGS. 1A-1B and 2A-2C. Each alignment pin may be utilized to facilitate electrostatic discharge via a corresponding electrostatic discharge path.

Figure 3:
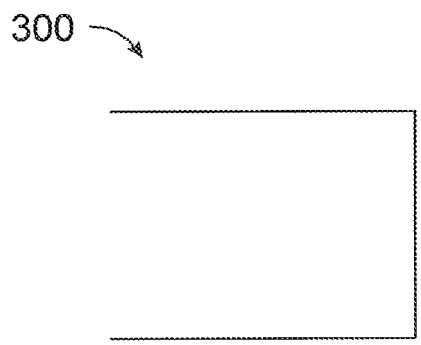
FIGS. 3 through 5 illustrate examples of an exposed portion of alignment pins in accordance with one or more embodiments of the present disclosure.
Figure 4:
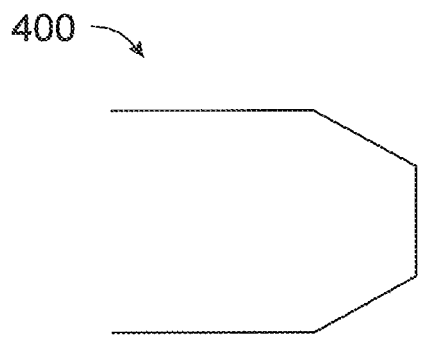
Figure 5:
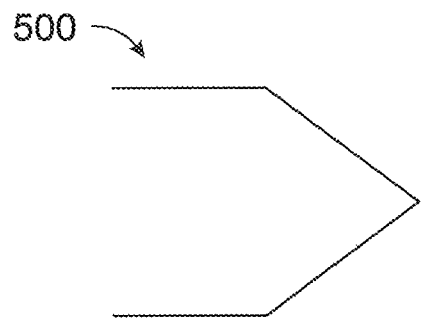

FIGS. 3, 4, and 5 illustrate examples of an exposed portion of an alignment pin in accordance with one or more embodiments of the present disclosure. In FIG. 3, an alignment pin 300 is a rectangular parallelepiped. In FIG. 4, an alignment pin 400 has a sloped-square shape, with the alignment pin 400 getting narrower toward its tip. An exposed portion of the alignment pins 300 and 400 includes an exposed rectangular surface. In an aspect, this exposed rectangular surface may contact the imager assembly 115 to facilitate electrostatic discharge mitigation. In FIG. 5, an alignment pin 500 has a conical shape or a pyramidal shape. An exposed portion of the alignment pin 500 includes its sharp tip. In an aspect, this sharp tip may contact the imager assembly 115 to facilitate electrostatic discharge mitigation. Other shapes, such as rounded alignment pins, may be utilized for facilitating mitigation of electrostatic discharge.

Figure 6:
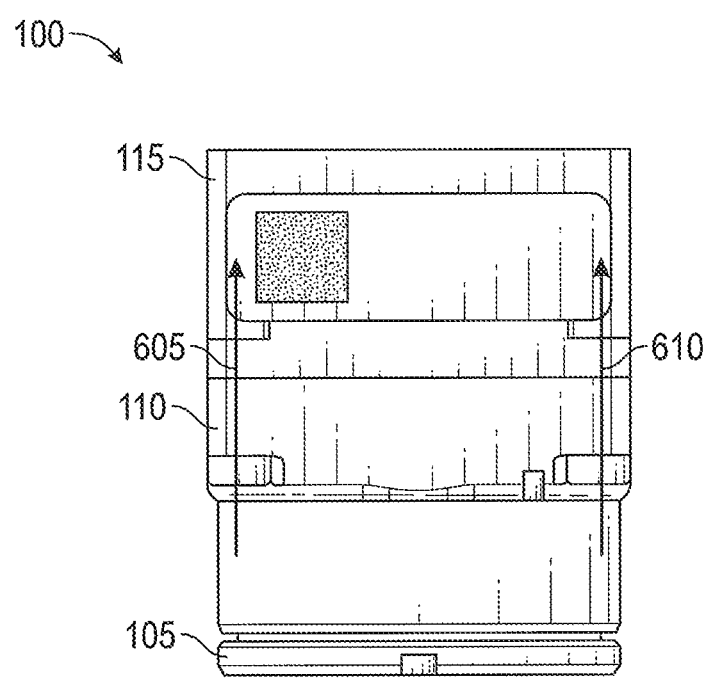
FIG. 6 illustrates examples of electrostatic discharge paths in accordance with one or more embodiments of the present disclosure.

FIG. 6 illustrates examples of conductive paths 605 and 610 for mitigating electrostatic discharge in accordance with one or more embodiments of the present disclosure. The alignment pins may be positioned to provide the conductive paths 605 and 610 along a periphery of the lens holder 110 and imager assembly 115 away from sensitive electronics in the imager assembly 115, rather than through a portion (e.g., a center portion) of the imager assembly 115 where sensitive electronics may be positioned. In FIG. 6, the conductive paths 605 and 610 provide parallel electrostatic dissipation paths from the lens holder 110 to and through the imager assembly 115 to mitigate electrostatic discharge that may cause malfunction and/or permanent damage to electronics in the imager assembly 115.

Size, shape, and/or position of alignment pins may be designed as appropriate to facilitate transfer of any accumulated charges on the lens holder 110 to electrostatic dissipation paths provided via contact of the alignment pins with the imager assembly 115. In some cases, alignment pins with narrower and/or sharper tips may provide higher electrostatic dissipation than wider and/or blunt tips.

Figure 7:
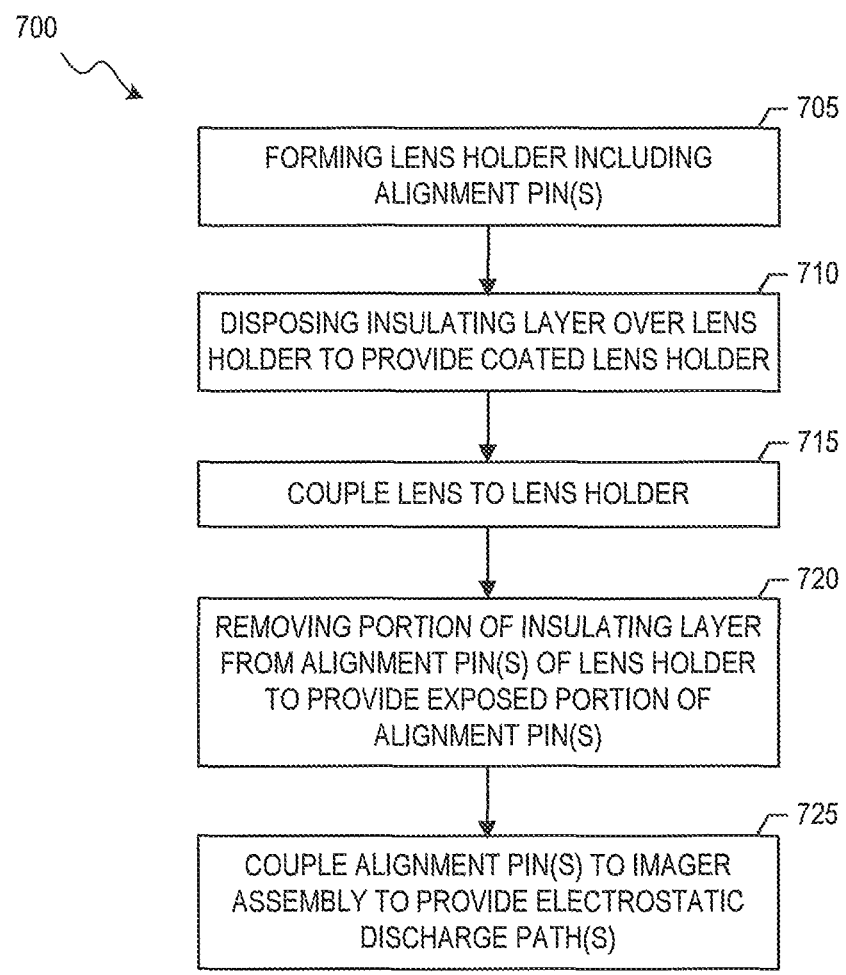
FIG. 7 illustrates a flow diagram of an example process for facilitating electrostatic discharge mitigation in accordance with one or more embodiments of the present disclosure.

FIG. 7 illustrates a flow diagram of an example process 700 for facilitating electrostatic discharge mitigation in accordance with one or more embodiments of the present disclosure. For explanatory purposes, the example process 700 is described herein with reference to the imaging device 100 of FIGS. 1A and 1B; however, the example process 700 is not limited to the example imaging device 100 of FIGS. 1A and 1B. Note that one or more operations may be combined, omitted, and/or performed in a different order as desired.

At block 705, a lens holder is formed. The lens holder may include a receiving interface (e.g., 130) configured to receive a lens assembly (e.g., 105) and one or more alignment pins (e.g., 210, 220) configured to couple to an imager assembly (e.g., 115). The lens holder may be formed of electrically conductive material, such as magnesium, magnesium alloy, and/or other electrically conductive material. At block 710, an insulating layer is disposed over the formed lens holder to provide a coated lens holder (e.g., the lens holder 110). The insulating layer may include an oxide material, such as keronite. At blocks 705 and 710, in an aspect, the alignment pin(s) may be formed together with the lens holder. In another aspect, the alignment pin(s) may be formed separately from the lens holder and then attached to the lens holder (e.g., before the insulating layer is disposed over the lens holder). At block 715, the lens assembly is coupled to the lens holder (e.g., the coated lens holder). For example, at least a portion of the lens assembly may be inserted into the receiving interface of the lens holder.

At block 720, a portion of the insulating layer is removed from the alignment pin(s) to expose the electrically conductive material underlying the portion of the insulating layer. The removal may be part of a post-machining process. The removal may include grinding down the alignment pin(s) to a desired size, shape, and/or other physical property. In some cases, the alignment pin(s) may be initially formed to have a longer length relative to a case in which the alignment pin(s) is not utilized for facilitating electrostatic dissipation (e.g., no portion of the alignment pin(s) is to be exposed). The longer length may then be grinded down to the desired size, shape, and/or other physical property. At block 725, the alignment pin(s) is coupled to the imager assembly to provide electrostatic discharge path(s) from the lens holder to and through the imager assembly. In this regard, to mitigate electrostatic discharge that may cause malfunctioning of and/or permanent damage to sensitive electronics of the imaging device 100 (e.g., the imager assembly 115), the alignment pin(s) are formed and/or attached (e.g., at block 705) at positions of the lens holder that allow the electrostatic discharge path(s) onto surfaces of the imager assembly (e.g., external surfaces of a sensor frame of the imager assembly 115) away from sensitive electronic components of the imager assembly.

Figure 8:
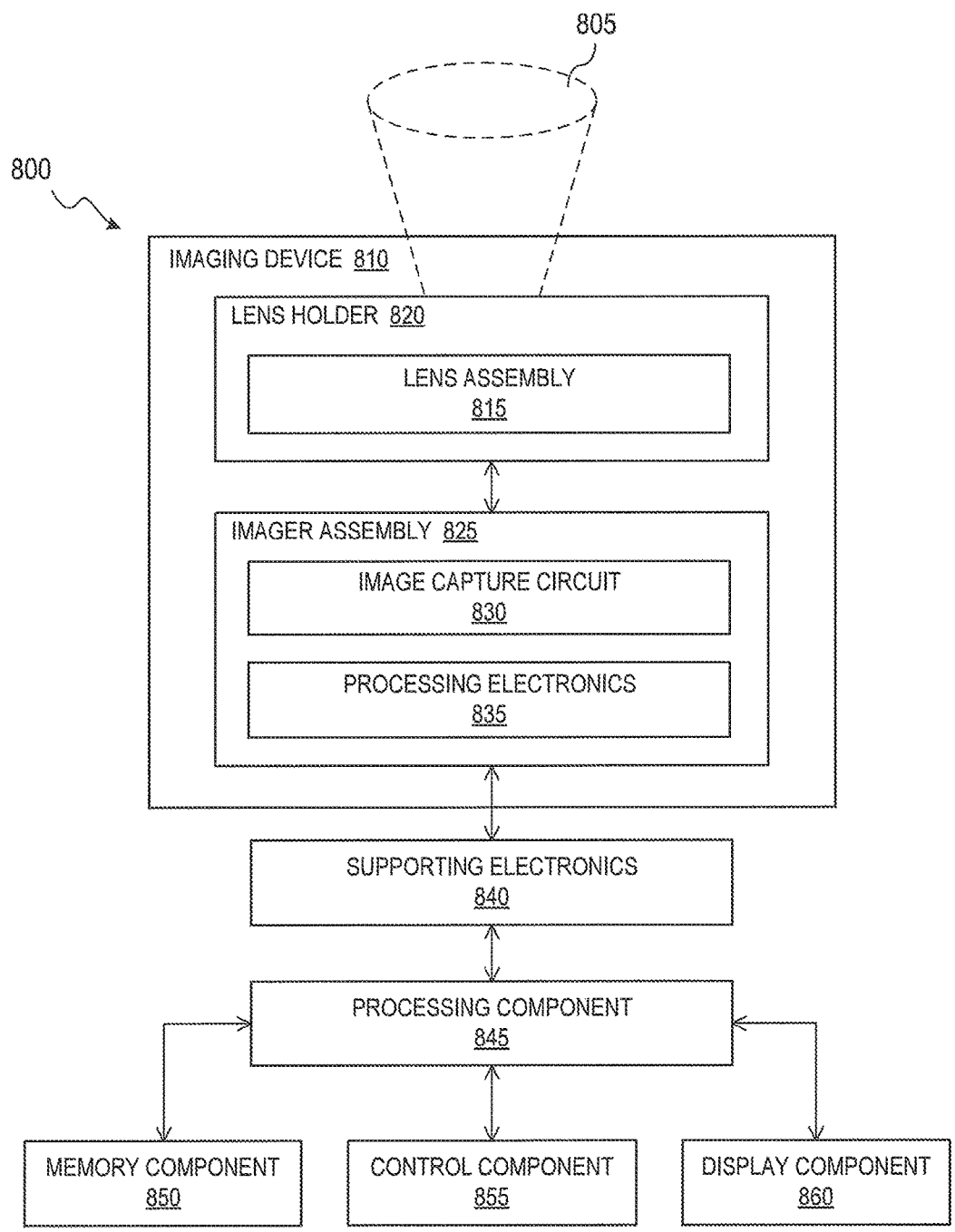
FIG. 8 illustrates a system in which electrostatic discharge mitigation is facilitated in accordance with one or more embodiments of the present disclosure.

FIG. 8 illustrates an imaging system 800 in which electrostatic discharge mitigation is facilitated in accordance with one or more embodiments of the present disclosure. Not all of the depicted components may be required, however, and one or more embodiments may include additional components shown in the figure. Variations in the arrangement and type of the components may be made without departing from the spirit or scope of the claims as set forth herein. Additional components, different components, and/or fewer components may be provided.

The imaging system 800 includes an imaging device 810, supporting electronics 840, processing component 845, memory component 850, control component 855, and display component 860. The imaging device 810 includes a lens assembly 815, a lens holder 820, and an imager assembly 825. The imager assembly 825 includes an image capture circuit 830 and processing electronics 835. In an embodiment, the imaging device 810 may be, may include, or may be a part of, the imaging device 100 of FIGS. 1A and 1B.

The lens holder 820 may receive the lens assembly 815 and may couple to the imager assembly 825. In an embodiment, the lens holder 820 includes one or more alignment pins with an exposed electrically conductive portion that couples to the imager assembly 825 to facilitate electrostatic discharge mitigation.

The image capture circuit 830 may include an image detector circuit (e.g., a thermal infrared detector circuit) and a readout circuit (e.g., an ROIC). The image detector circuit may capture image data associated with a scene 805 (e.g., a real world scene). For example, the image detector circuit may include a sensor assembly, such as an FPA (e.g., microbolometer FPA, photon detector FPA). In one case, the image detector circuit may capture (e.g., detect, sense) infrared radiation with wavelengths in the range from around 700 nm to around 1 mm, or portion thereof. For example, in some aspects, the image capture circuit 830 may be sensitive to (e.g., better detect) MWIR and/or LWIR radiation (e.g., electromagnetic radiation with wavelength of 7-14 µm). In another case, the image detector circuit may be sensitive to visible-light radiation. The readout circuit may be utilized as an interface between the image detector circuit that detects the image data and the processing electronics 835 that processes the detected image data as read out by the readout circuit.

The processing electronics 835 may receive, process, transmit, and/or record the captured image data. The processing electronics 835 may couple to the supporting electronics 840 that may further utilize (e.g., process, record, etc.) image data from the processing electronics 835. The processing component 845 may process image data (e.g., to provide processed image data) received, store the image data in the memory component 850, and/or retrieve stored image data from the memory component 850. In some cases, image data may be provided to the processing component 845 by the imaging device 810 (e.g., via the supporting electronics 840). In one aspect, the processing component 845 may perform various image processes including noise reduction and scaling of image data.

In various embodiments, the processing electronics 835, supporting electronics 840, and/or processing component 845 may include a processor, such as one or more of a microprocessor, a single-core processor, a multi-core processor, a microcontroller, a logic device (e.g., a programmable logic device (PLD) configured to perform processing functions), a digital signal processing (DSP) device, or other processing device. The processing component 845 may interface and communicate with the components 840, 850, 855, and 860. In some cases, the processing component 845 may interface and communicate with the imaging device 810 (e.g., via the processing electronics 835 and/or supporting electronics 840).

The memory component 850 may include one or more memory devices adapted to store data and information, including image data and information (e.g., metadata for the image data). The memory component 850 may include one or more various types of memory devices including volatile and non-volatile memory devices, such as random access memory (RAM), read-only memory (ROM), electrically-erasable read-only memory (EEPROM), flash memory, and/or other storage device/mechanism. The processing component 845 may execute software stored in the memory component 850.

The control component 855 may include a user input and/or interface device, such as a rotatable knob (e.g., potentiometer), push buttons, slide bar, keyboard, or other input/output device, that is adapted to generate a user input control signal. The processing component 845 may receive the control signal from the user via the control component 855 and respond appropriately. In one implementation, the user input may control various functions of the imaging system 800, such as autofocus, field of view, brightness, contrast, noise filtering, high pass filtering, low pass filtering, and/or various other features as understood by one skilled in the art. For example, the control component 855 may access and adjust the imaging device 810, such as adjust a zoom level or field of view of a lens of the lens assembly 815.

The display component 860 may include an image display device (e.g., a liquid crystal display (LCD)) or various other types of generally known video displays or monitors. The processing component 845 may provide image data and/or associated information to be displayed on the display component 860. In some cases, the display component 860 may receive image data and information contained in the memory component 850.

In an embodiment, to provide the imaging system 800, the components 840, 845, 850, 855, and 860 may be provided by a system coupled to the imaging device 810, such as a portable device (e.g., mobile phone), a vehicle (e.g., a terrestrial, naval, aerial, and/or space vehicle), or generally any electronic system that may utilize the imaging device 810 for imaging applications. The imaging device 810 may capture image data and provide the captured image data (e.g., with or without processing) to the system. In some cases, to provide the imaging system 800, the imaging device 810 may be incorporated into (e.g., integrated into) the system.

Where applicable, the various described embodiments may be implemented using hardware, software, or combinations of hardware and software. Also where applicable, the various hardware components and/or software components set forth herein may be combined into composite components comprising software, hardware, and/or both without departing from the spirit of the disclosure. Where applicable, the various hardware components and/or software components set forth herein may be separated into sub-components comprising software, hardware, or both without departing from the spirit of the disclosure. In addition, where applicable, it is contemplated that software components may be implemented as hardware components, and vice-versa. In some embodiments, such hardware components may be implemented as one or more appropriate processors and/or processing devices (e.g., logic device, microcontroller, processor, application specific integrated circuit (ASIC), field programmable gate array (FPGA), or other device) that may be used to execute appropriate instructions, such as software instructions implementing any of the processes described herein.

Software in accordance with the various described embodiments, such as program code and/or data, may be stored on one or more machine readable media. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

Embodiments described above illustrate but do not limit the present disclosure. It should also be understood that numerous modifications and variations are possible in accordance with the principles of the present disclosure. Accordingly, the scope of the present disclosure is defined only by the following claims.

What is claimed is:

1. An imaging device, comprising:
    an imager assembly; and
    a lens holder comprising:
        a receiving interface configured to receive a lens assembly therein; and
        an alignment pin comprising electrically conductive material and coupled to the imager assembly to provide an electrostatic discharge path via the imager assembly, wherein a first portion of the alignment pin has the electrically conductive material exposed and a second portion of the alignment pin has an insulating layer disposed on the electrically conductive material.

2. The imaging device of claim 1, further comprising one or more additional alignment pins comprising electrically conductive material and coupled to the imager assembly to provide one or more additional electrostatic discharge paths via the imager assembly.

3. The imaging device of claim 2, wherein the alignment pin and the one or more additional alignment pins are parallel with each other to provide parallel paths for electrostatic discharge, and wherein the parallel paths are along a periphery of the lens holder and the imager assembly.

4. The imaging device of claim 1, wherein the first portion of the alignment pin is configured to contact an external surface of the imager assembly to provide the electrostatic discharge path.

5. The imaging device of claim 4, wherein the first portion of the alignment pin slopes inwards from a first end to a second end such that the first end is larger than the second end, and wherein the second end is configured to be in contact with the external surface of the imager assembly.

6. The imaging device of claim 4, wherein the external surface of the imager assembly is electrically conductive.

7. The imaging device of claim 1, wherein the second portion of the alignment pin is a remaining portion of the alignment pin.

8. The imaging device of claim 1, wherein the insulating layer comprises an oxide coating.

9. The imaging device of claim 8, wherein the oxide coating comprises a keronite coating.

10. The imaging device of claim 1, further comprising the lens assembly, wherein the electrically conductive material comprises magnesium.

11. A method of making an imaging device, the method comprising:
    providing a lens holder coated with an insulating layer, wherein the lens holder comprises an alignment pin, and wherein the alignment pin comprises electrically conductive material with the insulating layer disposed thereon;
    removing a portion of the insulating layer from the alignment pin to provide an exposed portion of the alignment pin; and
    coupling the alignment pin to an imager assembly to provide an electrostatic discharge path via the imager assembly.

12. The method of claim 11, wherein the removing comprises grinding down the portion of the insulating layer from the alignment pin to provide the exposed portion.

13. The method of claim 11, wherein the coupling comprises:
    attaching the lens holder to the imager assembly using one or more engagement elements; and
    providing contact between the exposed portion of the alignment pin and the imager assembly.

14. The method of claim 13, wherein the exposed portion of the alignment pin is in contact with an external surface of the imager assembly.

15. The method of claim 14, wherein the exposed portion of the alignment pin slopes inwards from a first end to a second end, and wherein the second end is in contact with the external surface of the imager assembly.

16. The method of claim 11, wherein the providing comprises:
    forming the lens holder including the alignment pin; and
    coating the lens holder with the insulating layer to provide the lens holder coated with the insulating layer.

17. The method of claim 11, further comprising inserting a lens assembly within a receiving interface of the lens holder.

18. The method of claim 11, wherein the insulating layer comprises a keronite coating, and wherein the electrically conductive material comprises magnesium.

19. The imaging device of claim 1, further comprising an engagement element that secures the lens holder to the imager assembly, wherein the imager assembly comprises at least one image sensor configured to capture image data of a scene.

20. The imaging device of claim 1, wherein the lens assembly, the lens holder, and the imager assembly share a common optical axis.

* * * * *